(12) United States Patent
Chiu (10) Patent No.: US 9,350,463 B2
(45) Date of Patent: May 24, 2016

(54) ELECTRONIC DEVICE, COMMUNICATION METHOD, AUDIO DEVICE AND AMPLIFIER DEVICE USING PULSE DENSITY MODULATION FOR COMMUNICATION

(71) Applicant: REALTEK SEMICONDUCTOR CORPORATION, Hsinchu (TW)

(72) Inventor: Sheng-Nan Chiu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 65 days.

(21) Appl. No.: 14/206,957

(22) Filed: Mar. 12, 2014

(65) Prior Publication Data

US 2014/0328381 A1    Nov. 6, 2014

(30) Foreign Application Priority Data

May 2, 2013    (TW) .............................. 102115652 A (51) Int. Cl.
*G06F 17/00* (2006.01)
*H04B 14/02* (2006.01)
*H03M 5/08* (2006.01)
*H03M 1/82* (2006.01)

(52) U.S. Cl.
CPC ............. *H04B 14/026* (2013.01); *H03M 1/822* (2013.01); *H03M 5/08* (2013.01)

(58) Field of Classification Search
CPC ....... H03M 1/822; H03M 3/458; H03M 3/50; H03M 5/08; H04B 14/26; H03F 2200/345
See application file for complete search history.

(56) References Cited

U.S. PATENT DOCUMENTS

| | | | | |
|---|---|---|---|---|
| 6,317,067 | B1 * | 11/2001 | Mohindra | 341/145 |
| 6,317,457 | B1 * | 11/2001 | Naruse et al. | 375/237 |
| 2007/0252644 | A1 * | 11/2007 | Ohama et al. | 330/10 |
| 2012/0139768 | A1 * | 6/2012 | Loeda et al. | 341/143 |

* cited by examiner

*Primary Examiner* — Andrew C Flanders
(74) *Attorney, Agent, or Firm* — WPAT, P.C., Intellectual Property Attorneys; Anthony King (57) ABSTRACT

The present invention discloses an electronic device using pulse density modulation for communication, comprising: a pulse density modulation interface; a first circuit to output a clock signal and a data signal through the pulse density modulation interface; and a second circuit to receive the clock and data signals and thereby determine whether the level change times of the data signal reach a predetermined threshold while the clock signal remains unchanged, so as to verify whether the clock and data signals satisfy a start protocol. In an embodiment of the present invention, the above-mentioned predetermined threshold is equal to or more than three.

20 Claims, 4 Drawing Sheets

ELECTRONIC DEVICE, COMMUNICATION METHOD, AUDIO DEVICE AND AMPLIFIER DEVICE USING PULSE DENSITY MODULATION FOR COMMUNICATION

BACKGROUND OF THE INVENTION

1. Field of the Invention

The present invention relates to devices and methods using pulse density modulation, especially to an electronics device, a communication method, an audio device and an amplifying device using pulse density modulation for communication.

2. Description of Related Art

Pulse density modulation (PDM) is a modulation technique to express an analog signal by a stream composed of many one-bit digital signals. Unlike pulse code modulation (PCM) which evaluates analog signals of different amplitudes by distinct multi-bits digital signals, pulse density modulation shows the strength of an analog signal by the density of said one-bit digital signals.

Generally speaking, a pulse density modulation interface is quite simple, which is composed of a clock pin and a data pin and usually applied to an audio device. Said clock pin can transmit a clock signal; and said data pin can transmit signals of left and right sound channels in light of the rising and falling edges of the clock signal respectively. Because of the simple hardware frame of pulse density modulation, a former pulse density modulation interface is limited to data transmission with no control function in the early days, but the state of the art has allowed the pulse density modulation interface to transmit a specific data pattern for write control; more specifically, a modern pulse density modulation interface is capable of transmitting digital data in a specific pattern (e.g. 11000101 or 10010101 repeating for 64 times) according to the periodic change of the foresaid clock signal, so as to control a reception end to perform a write process in accordance with the digital data (e.g. 11000101 repeating for 64 times indicating that a value "1" should be written down, and 11000101 repeating for 64 times indicating that a value "0" should be written down). However, this control method can only manipulate a predetermined component in the reception end, but can't choose a component in interest to perform a write process; moreover, the control method only allows a transmission end to control a reception end in a unidirectional way, which means that the reception end is not able to provide data for the transmission end reversely.

SUMMARY OF THE INVENTION

In consideration of the imperfections of the prior art, an object of the present invention is to provide an electronic device, a communication method, an audio device and an amplifying device using pulse density modulation for communication, so as to make an improvement over the prior art.

The present invention discloses an electronic device using pulse density modulation for communication. An embodiment of said electronic device comprises: a pulse density modulation interface; a first circuit to output a clock signal and a data signal through the pulse density modulation interface; and a second circuit to receive the clock and data signals through the pulse density modulation interface and determine whether the level change times of the data signal reach a predetermined threshold while the clock signal remains unchanged, so as to verify whether the clock and data signals conform to a start protocol, wherein the predetermined threshold is equal to or more than three.

In the above embodiment, after the first circuit outputted the clock and data signals conforming to the start protocol, the first circuit is operable to output write information to the second circuit through the pulse density modulation interface, so as to allow the second circuit to perform a process in accordance with the write information. Besides, the first circuit is also operable to output a read request to the second circuit through the pulse density modulation interface to thereby make the second circuit provide read data for the first circuit through the pulse density modulation interface. Accordingly, a bilateral communication can be realized.

The present invention also discloses a communication method using pulse density modulation for communication, which is carried out by the electronic device of the present invention or its equivalent. An embodiment of said method comprises a modulation output step and a reception decision step. Said modulation output step includes: keeping the level of a clock signal unchanged and outputting the clock signal through a pulse density modulation interface; and changing the level of a data signal for N times and outputting the data signal through the pulse density modulation interface during the level of the clock signal staying the same in which the N is equal to or more than 3. Said reception decision step receives the clock and data signals through the pulse density modulation interface, and includes: determining whether the level change times of the data signal reach the N times while the level of the clock signal remains the same, so as to verify whether a start protocol is accomplished.

The above mentioned communication method can further comprise: an access request step to output write information or a read request through the pulse density modulation interface if the reception decision step determines that the start protocol is verified; and an access respondent step to receive the write information or the read request through the pulse density modulation interface, and perform a process according to the write information or provide read data through the pulse density modulation interface according to the read request.

The present invention further discloses an electronic device using pulse density modulation for communication, which carries out an access operation if a start protocol is verified. An embodiment of said electronic device comprises: a pulse density modulation interface including a clock path and a data path; a first circuit to output a clock signal through the clock path and a data signal through the data path; and a second circuit to receive the clock signal through the clock path and the data signal through the data path, and determine whether the clock and data signals conform to the start protocol, wherein if the clock and data signals conform to the start protocol, the first circuit is operable to output write information to the second circuit through the pulse density modulation interface to thereby allow the second circuit to perform a process in accordance with the write information, and operable to output a read request to the second circuit through the pulse density modulation interface to thereby allow the second circuit to provide read data for the first circuit through the pulse density modulation interface in accordance with the read request.

The present invention further discloses an audio device using pulse density modulation for communication. An embodiment of said audio device comprises: a pulse density modulation interface composed of a clock path and a data path; and an audio circuit to output a clock signal through the clock path and a data signal through the data path, and notify a reception end of preparing for an access operation by the clock and data signals, wherein when the audio circuit is operable to notify the reception end of preparing for the access operation, the audio circuit keeps the level of the clock signal unchanged and changes the level of the data signal for at least three times to thereby accomplish the notification.

The present invention further discloses an amplifying device using pulse density modulation for communication. An embodiment of said amplifying device comprises: a pulse density modulation interface composed of a clock path and a data path; and an amplifying circuit to receive a clock signal through the clock path and a data signal through the data path, and determine whether the level change times of the data signal reach a predetermined threshold during the level of the clock signal remaining unchanged, so as to decide whether to execute an access operation, wherein the predetermined threshold is equal to or more than three.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The following description is written by referring to terms of this invention field. If any term is defined in the specification, such term should be explained accordingly. Besides, the connection between objects or events in the following embodiments can be direct or indirect provided that these embodiments are still applicable under such connection. Said "indirect" means that an intermediate object or a physical space is existed between the objects, or an intermediate event or a time interval is existed between the events. In addition, the following description relates to pulse density modulation (PDM), and the detail known in this field will be omitted if such detail has little to do with the features of the present invention. Furthermore, the shape, size, and ratio of any element and the step sequence of any flow chart in the disclosed figures are just exemplary for understanding, not for limiting the scope of this invention.

Besides, each embodiment in the following description includes one or more features; however, this doesn't mean that one carrying out the present invention should make use of all the features of one embodiment at the same time, or should only carry out different embodiments separately. In other words, if an implementation derived from one or more of the embodiments is applicable, a person of ordinary skill in the art can selectively make use of some or all of the features in one embodiment or selectively make use of the combination of some or all features in several embodiments to have the implementation come true, so as to increase the flexibility of carrying out the present invention.

The present invention discloses devices and methods using pulse density modulation for communication. The devices and methods are applicable to an audio system (e.g. an audio player or an audio recorder) or other systems using pulse density modulation (e.g. a dimming system); however, these applications are not limitations to the present invention, just for understanding. People of ordinary skill in the art can choose components or steps equivalent to those described in this specification to carry out the present invention, which means that the scope of this invention is not limited to the embodiments in the specification. On account of that some or all elements of said device invention could be known, the detail of such elements will be omitted provided that this omission nowhere dissatisfies the specification and enablement requirements. Besides, said method invention can be in the form of firmware and/or software which could be carried out by the device of this invention or the equivalent thereof; hence, the following description on the method invention will abridge the hardware details or well-known parts provided that the remaining disclosure is still enough for understanding and enablement.

Figure 1:
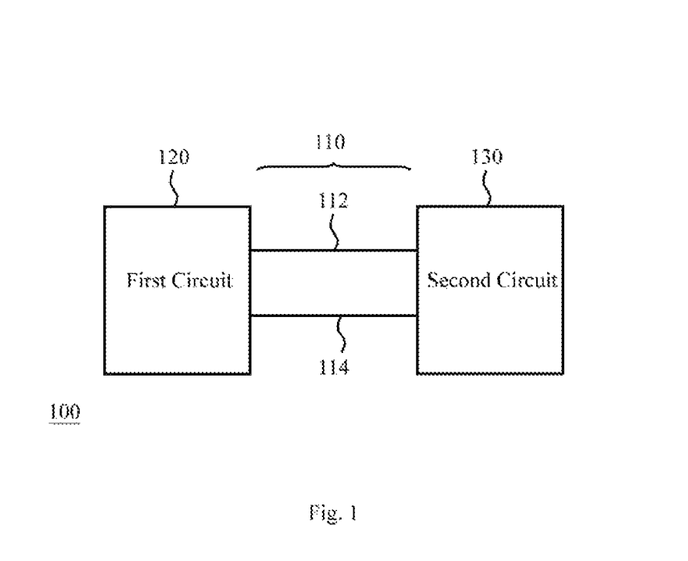
FIG. 1 illustrates an embodiment of the electronic device using pulse density modulation for communication according to the present invention.

Please refer to FIG. 1 which illustrates an embodiment of the electronic device of the present invention using pulse density modulation for communication. This embodiment is capable of executing a write or read operation after a start protocol is verified, and the electronic device 100 in this embodiment comprises: a pulse density modulation interface 110 including a clock path 112 and a data path 114 or simply composed of the clock and data paths 112, 114 without any other paths; a first circuit 120, coupled with the pulse density modulation interface 110, to output a clock signal through the clock path 112 and a data signal through the data path 114; and a second circuit 130 to receive the clock signal by the clock path 112 and the data signal by the data path 114, and then verify whether the aforementioned start protocol is accomplished according to the clock and data signals. For example, said second circuit 130 can check to see if the level change times of the data signal (e.g. the total number of the rising and falling edges of the data signal) reach a predetermined threshold while the level of the clock signal remains unchanged, so as to determine whether the clock and data signals from the first circuit 120 conform to the start protocol. In this embodiment, said predetermined threshold is equal to or more than three.

In light of the above, in the present embodiment, said first circuit 120 includes an audio circuit (such as an audio codec (coder/decoder)) to output a digital audio signal; said second circuit 130 includes one or more amplifying circuits to amplify the digital audio signal for sound playing. When the first circuit 120 is going to change one or more setting values of the second circuit 130 to realize different playing effects, or read one or more setting values of the second circuit 130 to ascertain its hardware capability for an adaptive adjustment, the first circuit 120 will modify the foresaid clock and data signals in a predetermined manner and output them to the second circuit 130, so as to notify the second circuit 130 of a coming write or read operation. More specifically, the second circuit 130 will find out whether the foresaid start protocol is satisfied according to the clock and data signals and thereby carry out the write or read operation if the start protocol is accomplished. Besides, in order to prevent the noise caused by the data signal for start protocol negotiation, the first circuit 120 may give the second circuit 130 a mute indication by transmitting a predetermined digital data stream to the second circuit 130 in accordance with the level variation of the clock signal before notifying the second circuit 130 of preparing the write/read operation, which consequently keeps the second circuit 130 silent; afterwards, the first circuit 120 may modulate the clock and data signals in a predetermined manner and output the modulated signals to the second circuit 130 for initializing a following procedure (e.g. said write or read operation). Please note that said mute indication could be replaced by some other indication such as a low volume indication as long the noise could be eliminated or eased. Please also note that although this embodiment adopts the audio circuit and amplifying circuit for instance, such instance is merely for those of ordinary skill in the art to understand the present invention, not for limiting the present invention. In other words, said first and second circuits may comprise other circuits (e.g. a dimming circuit and a lighting circuit) to realize other applications.

Figure 2:
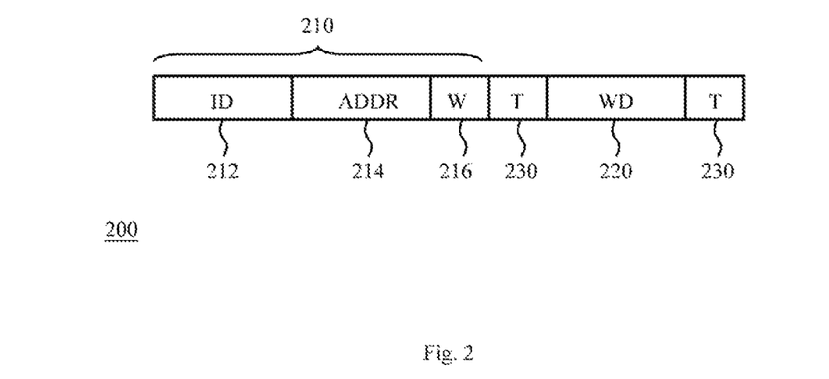
FIG. 2 illustrates an example of the write information according to the present invention.
Figure 3:
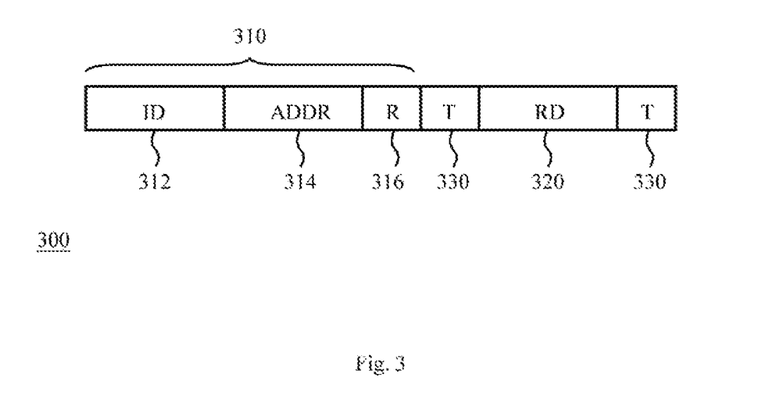
FIG. 3 illustrates an example of the read information according to the present invention.

Besides, in order to achieve said write/read operation, after the first circuit 120 outputted the clock and data signals conforming to the start protocol, the first circuit 120 is operable to output write information to the second circuit 130 through the pulse density modulation interface 110, so as to allow the second circuit 130 to perform a process in accordance with the write information; furthermore, the first circuit 120 is also operable to output a read request to the second circuit 130 through the pulse density modulation interface 110, so that the second circuit 130 can provide read data for the first circuit 120 through the pulse density modulation interface 110 in response to the read request. Please refer to FIG. 2, an example of said write information 200 (Write Info) includes: a write request 210, write data (WD) 220 and an interval column (T) 230 standing between the write request 210 and the write data 220. Said write request 210 includes a write component identification code (ID) 212, a memory write address (ADDR) 214 and a write indication (W) 216 in which the write component identification code 212 plays a role to point out at least one component in the second circuit 130, the memory write address 214 plays a role to indicate a data storage address in connection with the at least one component, and the write indication 216 is an instruction to ask the second circuit 130 to prepare for a write operation. Said write data is used to update the information of the memory write address 214. Said interval column 230 is used to handle the period of access transition between the write request 210 and the write data 220; in the meantime, another interval column 230 may be set behind the write data 220 as the separation from a next data. Similarly, as shown in FIG. 3, an example of said read request 310 includes: a read component identification code (ID) 312, a memory read address (ADDR) 314 and a read indication (R) 316 in which the read component identification code 312 is for indicating at least one component in the second circuit 130, the memory read address 314 is for indicating a data storage address in connection with the at least one component, and the read indication 316 is for asking the second circuit 130 to prepare for a read operation. After the second circuit 130 received the read request 310, it can provide read data (RD) 320 in association with the memory read address 314 for the first circuit 120; similarly, an interval column (T) 330 may exist between the read request 310 and the read data 320 to deal with a period of access transition while another interval column may exist behind the read data 320 as a separation. In this embodiment, said read request 310, interval column 330 and read data 320 are included in read information (Read Info) 300.

Please note that the formats of the above-described write information 200 and read information 300 are exemplary, not limitation. Other known or self-defined formats could be adopted in this invention provided that the whole invention is still workable. For instance, if the intended objects of the write and read operations are one and the same and constant, the aforementioned write component identification code 212 and read component identification code 312 will become unnecessary, which means that in this case the write information 200 may merely include the memory write address 214, write indication 216, write data 220 and interval column 230 while the read information may merely include the memory read address 314, read indication 316, read data 320 and interval column 330. For another instance, if the interval columns 230, 330 have little to do with the second circuit 130 taking care of the write information 200 and/or read information 300, they won't be necessary.

Figure 4:
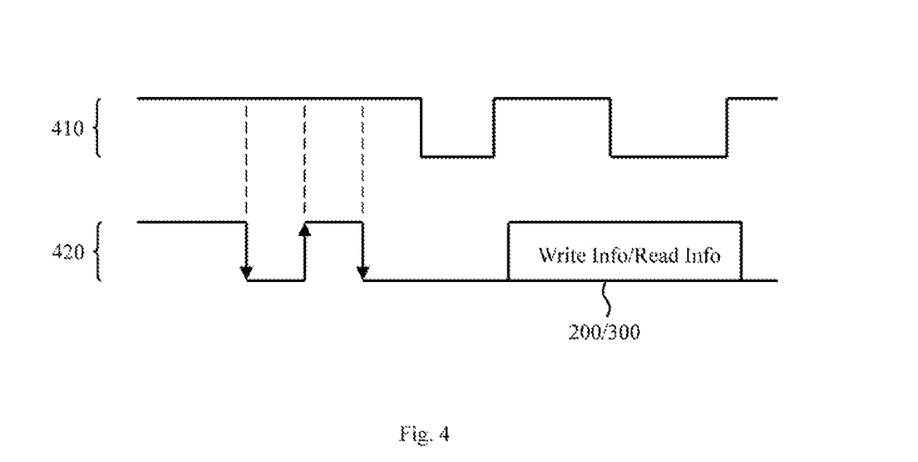
FIG. 4 illustrates a scenario of the clock and data signals conforming to a start protocol according to the present invention.
Figure 5:
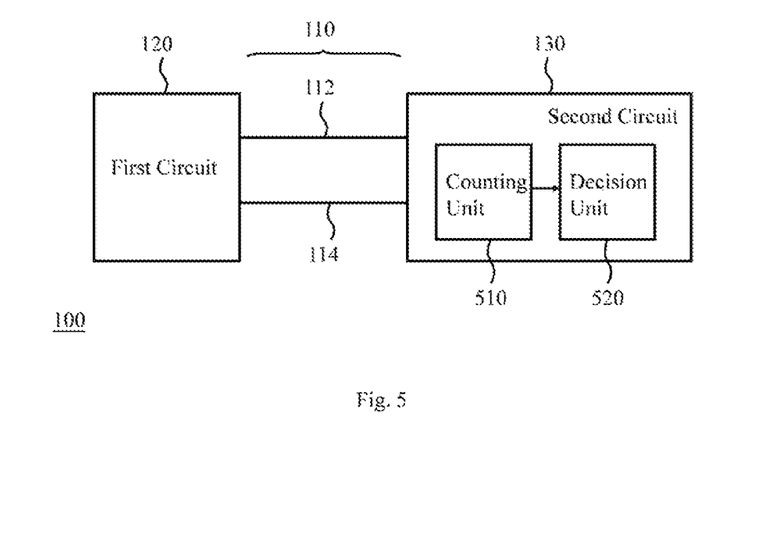
FIG. 5 illustrates an embodiment of the second circuit in FIG. 1.

The foresaid start protocol is the key to determining whether the write or read operation should go on. As the previous description said, the embodiment of FIG. 1 defines the start protocol by a specific combination of the clock and data signals; more specifically, as shown in FIG. 1 and FIG. 4, the second circuit 130 will determine that the clock signal 410 and the data signal 420 fulfill the start protocol jointly if the clock signal 410 remains unchanged (e.g. the clock signal 410 staying at a high or low level as the dotted line in FIG. 4 pointed out) and the level change times of the data signal 420 reach a predetermined threshold (e.g. the threshold equal to or more than three as the arrows in FIG. 4 show). Furthermore, in order to find out whether the start protocol is accomplished, as shown in FIG. 5, an embodiment of the second circuit 130 includes: a counting unit 510 to count the level change times of the data signal during the level of the clock signal keeping the same, and thereby generate a counting result; and a decision unit 520 to compare the counting result with the predetermined threshold and accordingly determine whether the clock and data signals conform to the start protocol jointly. Moreover, in an alternative embodiment of the present invention, the decision unit 520 can reset the counting unit 510 for the next determination after finishing comparing the counting result with the predetermined threshold. Please note that the given embodiment of the second circuit 130 is exemplary, not limitation; other equivalent circuits could be used to implement the second circuit 130. For instance, the counting unit 510 and the decision unit 520 can be realized through a ripple counter. Since the principle of ripple counter is taking the output signal of a previous stage to be the input clock of a next stage under the condition that the input signal (e.g. the clock signal of FIG. 4) of each stage keeps the same, if the level of the output signal at the last stage of a K-stages ripple counter changed, it means that the level of the input clock (e.g. the data signal of FIG. 4) of the K-stages ripple counter changed for a certain times (e.g. $2^K$ times); therefore, the level state of the last output signal could be deemed an indication of the start protocol in satisfaction or dissatisfaction. Please also that the scenario of start protocol could be other combinations of the clock and data signals; for instance, the first circuit 120 may transmit the data signal in a specific duty cycle or pattern during the clock signal keeping the same to thereby notify the second circuit 130 of the start protocol. Since those ordinary skill in the art can appreciate how to choose an appropriate combination of the clock and data signals to represent the start protocol according to the teaching of the present invention, repeated and redundant description is therefore omitted.

Please refer to FIG. 1 again. The first circuit 120 in FIG. 1 could stand alone. For instance, the first circuit 120 could be an audio device using pulse density modulation for communication, comprising: a pulse density modulation interface composed of a clock path and a data path (such as a clock pin and a data pin); and an audio circuit to output a clock signal through the clock path and a data signal through the data path, and notify a reception end (such as the second circuit 130 in FIG. 1) of an access operation, wherein when the audio circuit is going to notify the reception end of the access operation, the audio circuit will keep the clock signal unchanged and change the level of the data signal for at least three times, so as to accomplish the notification. Similarly, the second circuit 130 in FIG. 1 (or FIG. 5) could stand alone. For instance, the second circuit 130 could be an amplifying device using pulse density modulation for communication, comprising: a pulse density modulation interface composed of a clock path and a data path (e.g. a clock pin and a data pin); and an amplifying circuit to receive a clock signal through the clock path and a data signal through the data path, and verify whether the level change times of the data signal reach a predetermined threshold during the clock signal remaining unchanged, so as to determine whether to comply with a coming access operation request or not. Said predetermined threshold here could be equal to or more than three; and said amplifying circuit may include required or auxiliary circuits (e.g. the counting unit 510 and decision unit 520 in FIG. 5) for verifying whether the level change times of the data signals reach the predetermined threshold. As to more of the implementation details and modifications of said audio device and amplifying device, since one of ordinary skill in the art can appreciate the details and modifications through the fore-disclosed embodiments of FIG. 1 through FIG. 5, repeated and redundant description is therefore omitted to save pages.

Figure 6:
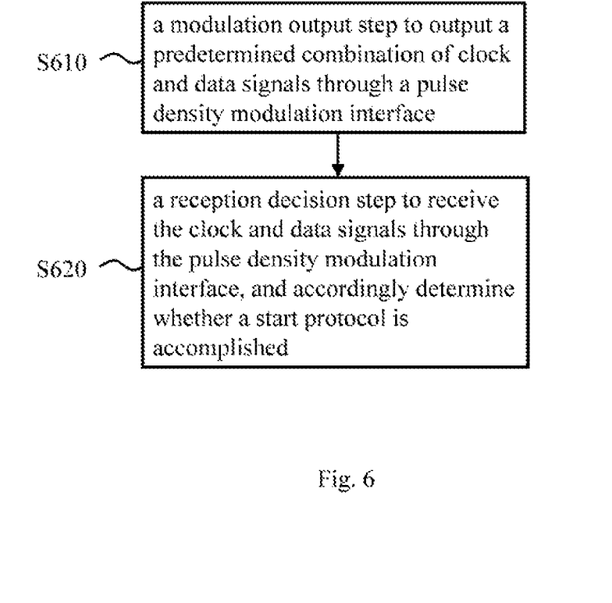
FIG. 6 illustrates an embodiment of the communication method using pulse density modulation for communication according to the present invention.

Please refer to FIG. 6. In addition to the foresaid electronic device, audio device and amplifying device, the present invention further discloses a communication method using pulse density modulation for communication. Said communication method can be carried out by the electronic device of the present invention or its equivalent, and comprises the following steps:

Step S610: a modulation output step to output a predetermined combination of clock and data signals through a pulse density modulation interface. In this embodiment, step S610 includes: keeping the level of a clock signal unchanged and outputting the clock signal through the pulse density modulation interface; and changing the level of a data signal for N times and outputting the data signal through the pulse density modulation interface while the level of the clock signal remains the same in which the N is equal to or more than 3.

Step S620: a reception decision step to receive the clock and data signals through the pulse density modulation interface, and accordingly determine whether a start protocol is accomplished. In this embodiment, step S620 includes: determining whether the level change times of the data signal reach the above-mentioned N times within a period that the level of the clock signal remains the same; if so, the start protocol is fulfilled, and if not, the start protocol is not yet fulfilled.

The aforementioned step S610 could be executed by a first circuit and step S620 could be executed by a second circuit. In this embodiment, the first circuit includes an audio circuit and the second circuit includes an amplifying circuit for realizing an application in the audio field. However, people of ordinary skill in the art may have the first and second circuits include other circuits (e.g. a dimming circuit and a lighting circuit) to realize other applications on the basis of the present invention. Please note that if this method embodiment is applied to an application of audio field, it may further include a mute step to avoid unwanted noise. This mute step should be executed before step S610, and could be accomplished by outputting a mute indication or a low volume indication through the pulse density modulation interface to quiet said second circuit.

Figure 7:
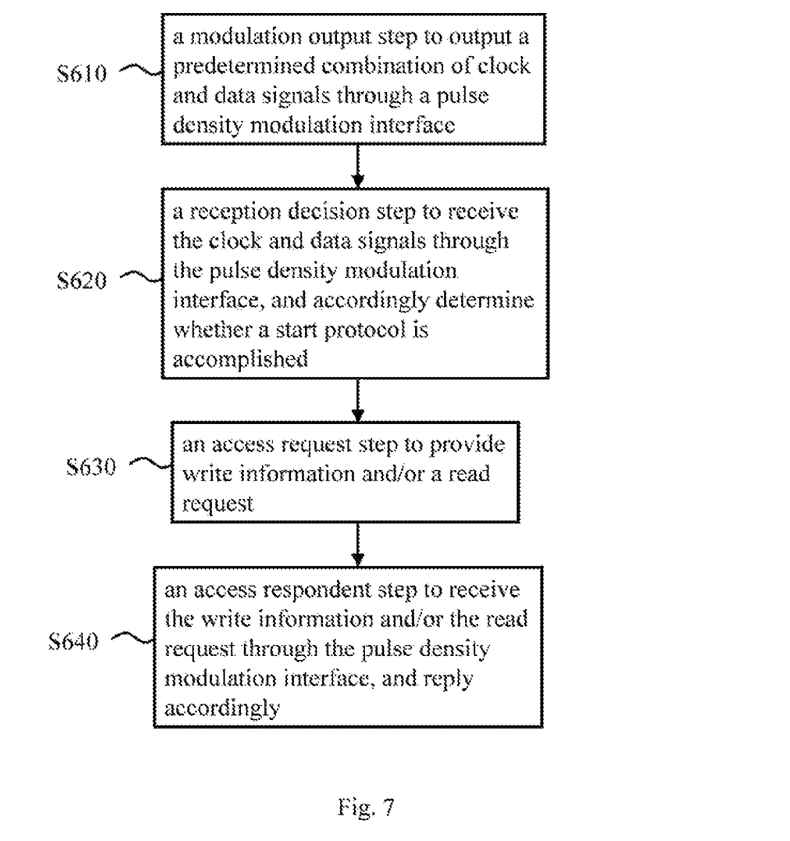
FIG. 7 illustrates another embodiment of the communication method using pulse density modulation for communication on the basis of FIG. 6.

Besides, once step S620 found that the start protocol is accomplished, this method embodiment may carry out the following steps (as shown in FIG. 7) for an access operation:

Step S630: an access request step to provide write information and/or a read request. In this embodiment, step S630 includes: outputting the write information and/or the read request through the pulse density modulation interface if step S620 determines that the start protocol is verified.

Step S640: an access respondent step to receive the write information and/or the read request through the pulse density modulation interface, and reply accordingly. In this embodiment, step S640 includes: performing a process according to the write information (e.g. a process to change at least a circuit setting value in accordance with the write information) or providing read data through the pulse density modulation interface according to the read request.

Similarly, since those of ordinary skill in the art can appreciate the implementation detail and modification of the method inventions in association with FIG. 6 and FIG. 7 by FIG. 1 through FIG. 5 and the descriptions thereof, repeated and redundant description is thus omitted. Please note that there is no step sequence limitation for the method inventions as long as the execution of each step is applicable.

To sum up, the present invention not only allows a transmission end (i.e. the aforementioned first circuit) to optionally control an object in interest, but also allows a reception end (i.e. the aforementioned second circuit) to provide data for the transmission end reversely; hence, the present invention achieves the purpose of flexible control and bilateral communication through a very limited transmission interface.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. An electronic device using pulse density modulation for communication, comprising:
   a pulse density modulation interface between a first circuit and a second circuit;
   the first circuit to output a clock signal and a data signal to the second circuit through the pulse density modulation interface; and
   the second circuit to receive the clock and data signals from the first circuit through the pulse density modulation interface and determine whether the level change times of the data signal reach a predetermined threshold while the clock signal remains unchanged, so as to verify whether the clock and data signals conform to a start protocol,
   wherein the predetermined threshold is equal to or more than three.

2. The electronic device of claim 1, wherein the first circuit includes an audio codec and the second circuit includes an amplifying circuit.

3. The electronic device of claim 2, wherein the first circuit outputs a mute indication or a low volume indication to the second circuit through the pulse density modulation interface before outputting the clock and data signals conforming to the start protocol.

4. The electronic device of claim 1, wherein after the first circuit outputted the clock and data signals conforming to the start protocol, the first circuit is operable to output write information and a read request to the second circuit through the pulse density modulation interface, so that the second circuit is operable to perform a process according to the write information and provide read data for the first circuit through the pulse density modulation interface according to the read request.

5. The electronic device of claim 4, wherein the write information includes: a write request including a memory write address and a write indication; and write data.

6. The electronic device of claim 4, wherein the read request includes a memory read address and a read indication.

7. The electronic device of claim 1, wherein the second circuit includes:
   a counting unit to count the level change times of the data signal under a condition that the clock signal remains unchanged and thereby generate a counting result; and
   a decision unit to compare the counting result with the predetermined threshold, and accordingly determine whether the clock and data signals conform to the start protocol.

8. The electronic device of claim 1, wherein the pulse density modulation interface is composed of a clock path and a data path.

9. A communication method of pulse density modulation, which is carried out by an electronic device using pulse density modulation for communication, comprising:
   a modulation output step including: keeping the level of a clock signal unchanged and outputting the clock signal from a first circuit to a second circuit through a pulse density modulation interface; and changing the level of a data signal for N times and outputting the data signal from the first circuit to the second circuit through the pulse density modulation interface while the level of the clock signal remains unchanged, in which the N is equal to or more than 3; and
   a reception decision step to receive the clock and data signals from the first circuit through the pulse density modulation interface, including: determining whether the level change times of the data signal reach the N times while the level of the clock signal remains the same, so as to determine whether a start protocol is accomplished.

10. The communication method of claim 9, wherein the modulation output step is carried out through a first circuit including an audio circuit, and the reception decision step is carried out through a second circuit including an amplifying circuit.

11. The communication method of claim 10, further comprising: a mute step to keep the second circuit quiet by outputting a mute indication or a low volume indication through the pulse density modulation interface before executing the modulation output step.

12. The communication method of claim 9, further comprising:
   an access request step including: outputting write information or a read request through the pulse density modulation interface if the reception decision step determines that the start protocol is verified; and
   an access respondent step to receive the write information or the read request through the pulse density modulation interface, including: performing a process according to the write information or providing read data through the pulse density modulation interface according to the read request.

13. The communication method of claim 12, wherein the step of performing the process according to the write information includes: changing at least a circuit setting value in accordance with the write information.

14. An electronic device using pulse density modulation for communication, which carries out an access operation if a start protocol is verified, comprising:
   a pulse density modulation interface including a clock path and a data path;
   a first circuit to output a clock signal through the clock path and a data signal through the data path; and
   a second circuit to receive the clock signal through the clock path and the data signal through the data path, and determine whether the clock and data signals conform to the start protocol,
   wherein after the clock and data signals conform to the start protocol, the first circuit is operable to output write information to the second circuit through the pulse density modulation interface to thereby allow the second circuit to perform a process in accordance with the write information, and operable to output a read request to the second circuit through the pulse density modulation interface to thereby allow the second circuit to provide read data for the first circuit through the pulse density modulation interface in accordance with the read request.

15. The electronic device of claim 14, wherein the first circuit includes an audio circuit and the second circuit includes an amplifying circuit.

16. The electronic device of claim 14, wherein the second circuit is further operable to determine whether the level change times of the data signal reach a predetermined threshold under a condition that the level of the clock signal remains unchanged, so as to verify whether the clock and data signals conform to the start protocol.

17. An audio device using pulse density modulation for communication, comprising:
   a pulse density modulation interface composed of a clock path and a data path; and
   an audio circuit to output a clock signal to a reception end through the clock path and output a data signal to the reception end through the data path, and notify the reception end of preparing for an access operation by the clock and data signals,
   wherein when the audio circuit is going to notify the reception end of preparing for the access operation, the audio circuit keeps the level of the clock signal unchanged while changing the level of the data signal for at least three times to accomplish notifying the reception end.

18. The audio device of claim 17, wherein after the audio circuit notified the reception end of preparing for the access operation, the audio circuit is operable to output write information or a read request to the reception end through the pulse density modulation interface, so as to initialize the access operation.

19. An amplifier device using pulse density modulation for communication, comprising:
   a pulse density modulation interface composed of a clock path and a data path; and
   an amplifying circuit to receive a clock signal through the clock path and receive a data signal through the data path, and determine whether the level change times of the data signal reach a predetermined threshold during the level of the clock signal remaining unchanged, so as to decide whether to execute an access operation, wherein the predetermined threshold is equal to or more than three.

20. The amplifier device of claim 18, wherein the amplifying circuit further includes:
 a counting unit to count the level change times of the data signal during the clock signal remaining unchanged and thereby generate a counting result; and
 a decision unit to compare the counting result with the predetermined threshold, and make the amplifying device execute the access operation if the counting result is equal to or more than the predetermined threshold.

* * * * *